(12) United States Patent
Chen et al.

(10) Patent No.: US 7,209,404 B2
(45) Date of Patent: Apr. 24, 2007

(54) LOW POWER MEMORY SUB-SYSTEM ARCHITECTURE

(75) Inventors: Sho-Mo Chen, Cupertino, CA (US); Fei Ye, Cupertino, CA (US); Feng Yang, Plano, TX (US)

(73) Assignee: ForteMedia Inc., Cupertino, CA (US)

( * ) Notice: Subject to any disclaimer, the term of this patent is extended or adjusted under 35 U.S.C. 154(b) by 82 days.

(21) Appl. No.: 11/198,563

(22) Filed: Aug. 5, 2005

(65) Prior Publication Data

US 2007/0030750 A1   Feb. 8, 2007

(51) Int. Cl.
*G11C 5/14* (2006.01)

(52) U.S. Cl. ...................... 365/226; 365/227
(58) Field of Classification Search ............... 365/226, 365/227, 230.06
See application file for complete search history.

(56) References Cited

U.S. PATENT DOCUMENTS 5,808,500 A    9/1998  Kalpakjian
6,141,283 A *  10/2000 Bogin et al. ............... 365/226
6,330,180 B2 * 12/2001 Noro et al. ................. 365/145
6,552,949 B1 *  4/2003 Silla et al. .................. 365/227
6,917,555 B2 *  7/2005 Bedwell et al. ............ 365/226

* cited by examiner

*Primary Examiner*—Anh Phung
(74) *Attorney, Agent, or Firm*—Perkins Coie LLP

(57) ABSTRACT

Disclosed methods and apparatus provide embedded memory architectures that lower the overall operational power consumption of memory arrays without sacrificing memory access speed. Because in large memory arrays the leakage current is a considerable portion of the overall power consumption, leakage reduction in memory arrays, manufactured by advanced processing technologies, is a major challenge. To reduce leakage, methods and apparatus are presented for memory access and for power- and ground-supply monitoring and management at memory sub-array level.

20 Claims, 11 Drawing Sheets

LOW POWER MEMORY SUB-SYSTEM ARCHITECTURE

TECHNICAL FIELD

The embodiments described below relate generally to memory arrays and, more particularly, to design of memory sub-systems for reducing power consumption.

BACKGROUND

In traditional continuous array memory architecture 100, illustrated in FIG. 1, the memory cells 110 along a row 112 of cells are "turned on" when the row decoder 114 selects the word-line 116 connected to the row 112 of memory cells. When the word-line 116 is activated, each of the cells 110 along that particular row are activated and the data content of each memory cell 110 is transferred to a respective bit-line 118. The bit-lines 118 are shared among the memory cells 110 of different rows 112 and are situated in a cell column 120, but, at a given time, only one cell 110 in each column 120 can transfer its data through its corresponding bit line 118. The column decoder 122 then selects which ones of the cells 110 of the row 112 will transfer their data to the outputs 124 of the memory chip by choosing the appropriate bit-lines 118.

This type of memory architecture, referred to as continuous array architecture, is still in use. Continuous array architecture and its associated read/write scheme are considered inefficient because in practice only a small number of cells need to be "ON" at any given time, and turning ON all the memory cells of a given row draws unnecessary current and needlessly increases power consumption.

Today's most memory designs utilize an architecture frequently referred to as block architecture, in which only a subset or a block of the memory cells are turned ON at a time. This architecture offers substantial power savings and increased speed.

In typical block architecture the memory array is split into separate blocks. Each block includes multiple memory cells, bit-lines connected to each column of memory cells which are selected by a column decoder, global word-lines which are selected by a row decoder, and groups of local word-lines. During operation, a block of memory cells is activated by a block signal. A block signal combines with a selected global word-line within the selected block to activate a local word-line and the corresponding memory cells. A local word-line will be activated only when both the appropriate block signal and the corresponding global word-line are activated. When a global word-line is selected, a local word-line is activated such that only a fraction of the memory cells in a given row are "turned on," rather than the entire row of memory cells. Therefore, less current is drawn and power consumption decreases.

However, to date, the main focus of the prior art in the area of low power memory design has only been to improve decoding circuits and the access paths (read/write paths).

DETAILED DESCRIPTION

Various embodiments of the invention will now be described. The following description provides specific details for a thorough understanding and enabling description of these embodiments. One skilled in the art will understand, however, that the invention may be practiced without many of these details. Additionally, some well-known structures or functions may not be shown or described in detail, so as to avoid unnecessarily obscuring the relevant description of the various embodiments.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

The embodiments disclosed in the following paragraphs provide embedded memory architectures that lower the overall operational power consumption of memory arrays without sacrificing the memory access speed. In order to decrease the overall power consumption in a memory block manufactured by the advanced processing technologies, such as 0.13 μm and beyond, reducing the leakage current in memory arrays becomes a major challenge. In a large memory array the leakage current is a large portion of the overall power consumption. The following disclosed methods lead to the reduction of memory arrays leakage current:

1. Reducing the power-supply voltage of the memory arrays (vdd_mem); and

2. Increasing the ground voltage of the memory arrays (gnd_mem).

Figure 1:
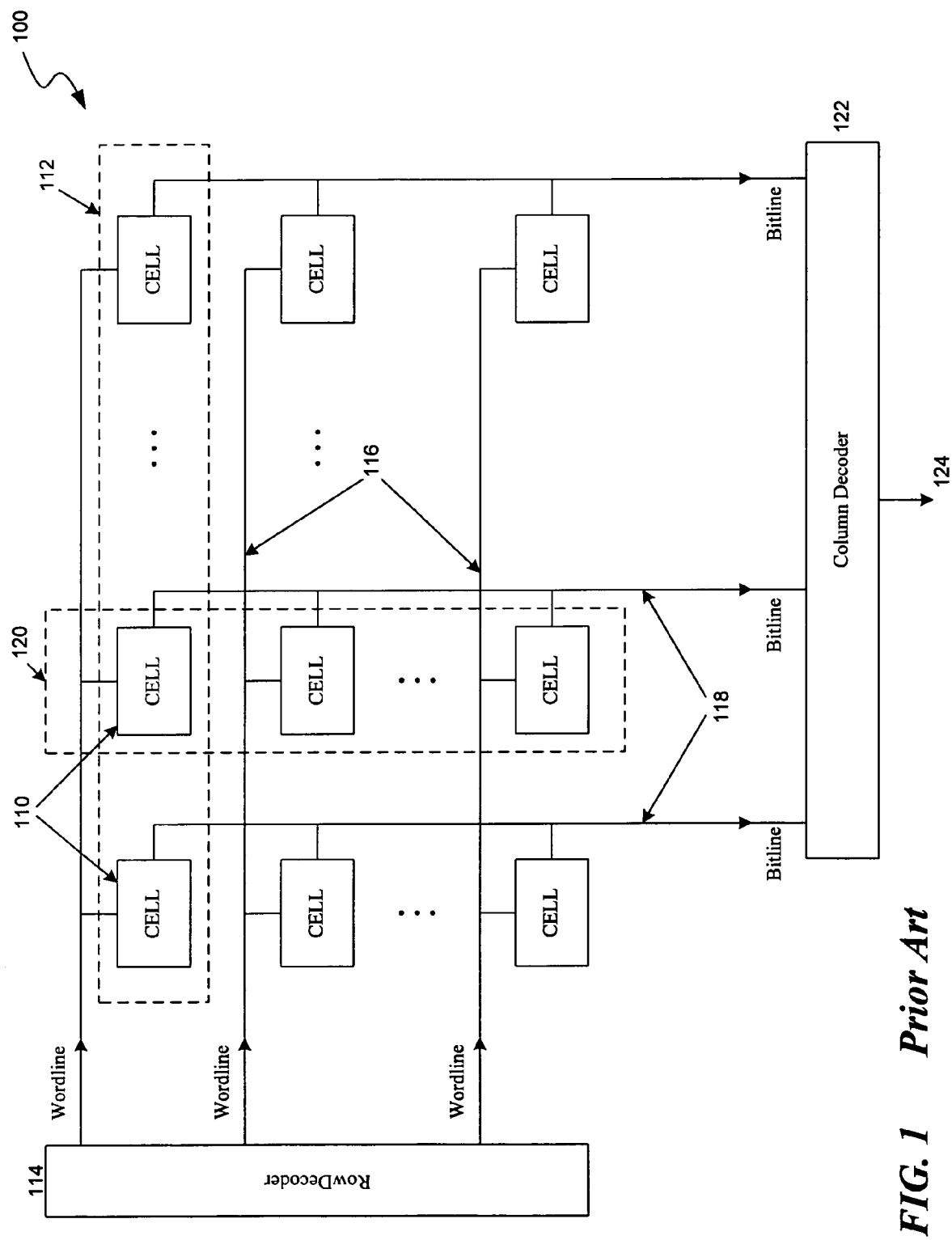
FIG. 1 illustrates a memory cell arrangement according to prior art.
Figure 2:
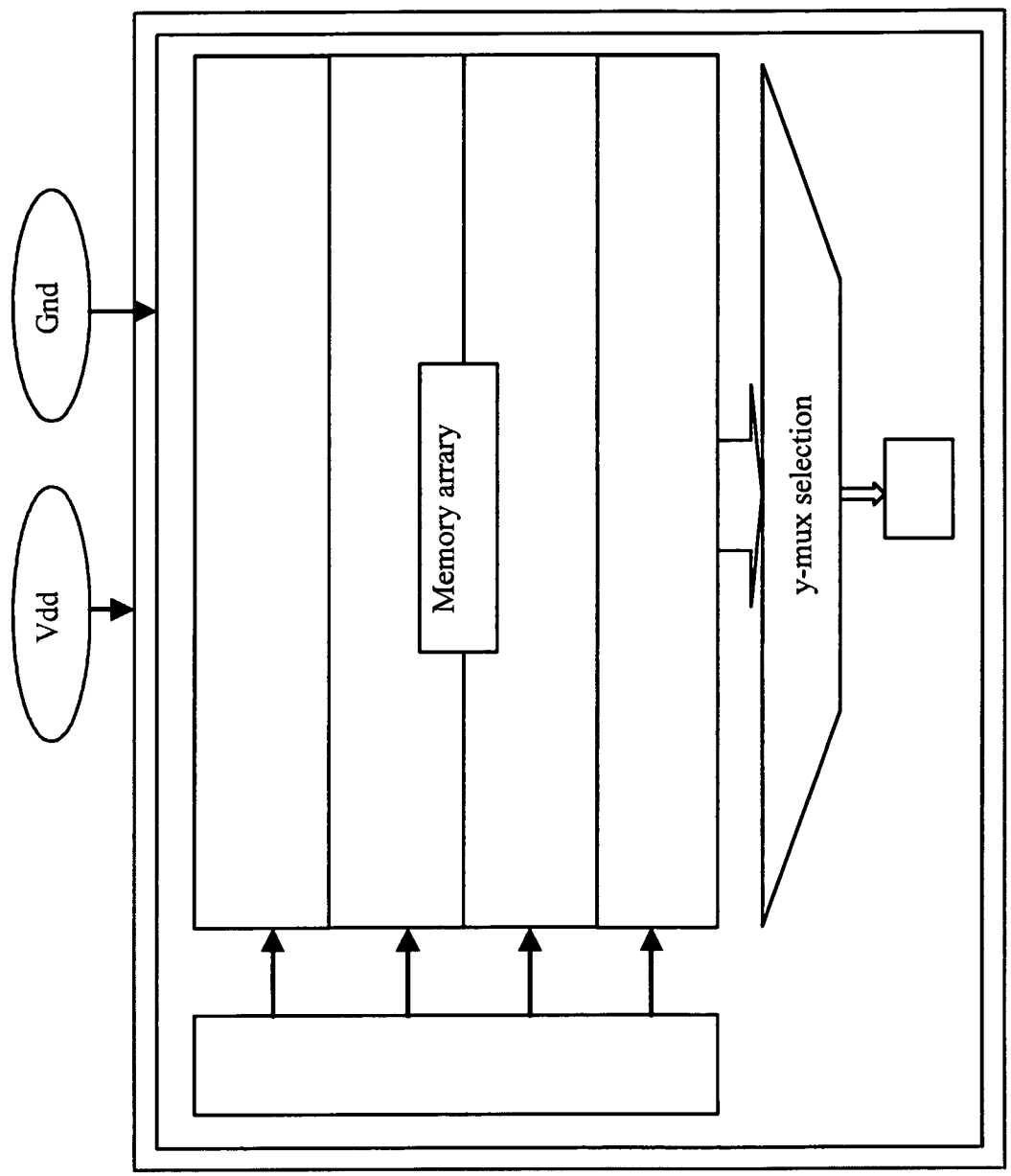
FIG. 2 illustrates a standard memory array architecture, where Vdd and Gnd are shared by an entire block.
Figure 3:
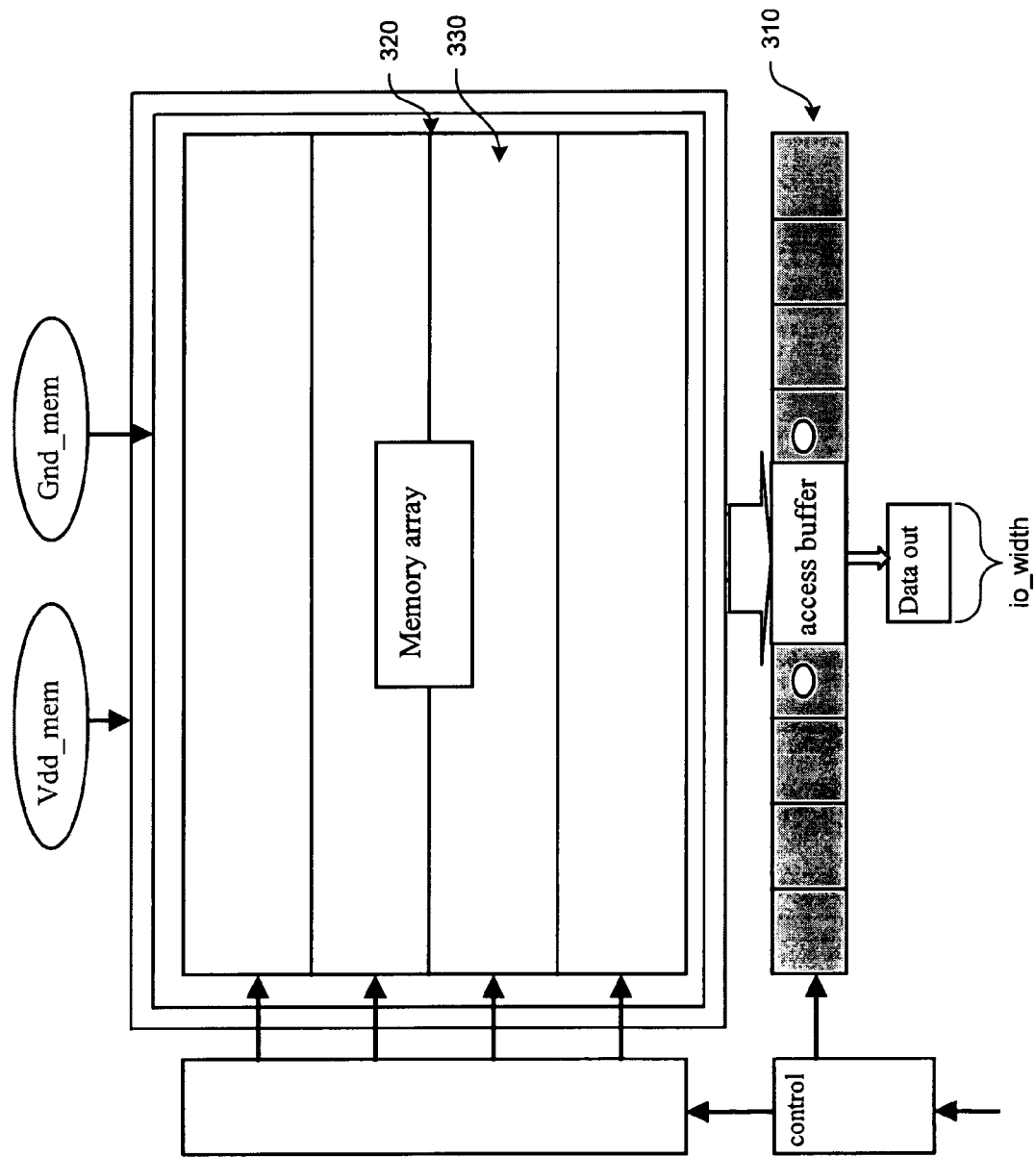
FIG. 3 illustrates a memory array with an access buffer and a separate power, where the memory array power is different from peripheral circuits.

Such changes to the power-supply and ground voltage levels are not practical in traditional circuit arrangements, such as the circuit shown in FIG. 2, in which same power and ground lines feed the memory array as well as the peripheral circuits. In contrast, an embodiment depicted in FIG. 3 illustrate separate power and ground lines dedicated to a memory array.

In another embodiment, while a memory array is not accessed, it stays in a "keep state" to reduce the leakage current. However, the memory array is moved to an "access state" when it needs to be accessed, and to access the memory at a desired speed, the power levels of the accessed sub-block are changed to the operation level of vdd_mem_op and gnd_mem_op. After the access operation is completed, the sub-array will be returned back to the "keep state."

While the up and down ramping of the power affects the memory access speed, it also consumes power. Therefore, it is desirable to reduce the frequency of the memory array access. In the embodiment illustrated in FIG. 3, an "access buffer" 310 is disclosed which serves as an interface between a memory array 320 and the external IO ports to reduce the memory access frequency.

When the memory array 320 is accessed, a whole cache line 330 is read into the access buffer 310, where a cache line is a line of memory cells controlled by the same word line. A single memory access only turns on a single word line, i.e., a cache line is accessed. However, only part of the cache line is read out (thru Y-mux) in a traditional memory design. The access buffer 310 stores the cache line 330 and allows "n" sequential memory access to its stored content, where n=cacheline/io_width. Because the size of the access buffer is relatively small, the access speed to the access buffer is relatively fast. For the same reason, the power consumption is also small.

Figure 4:
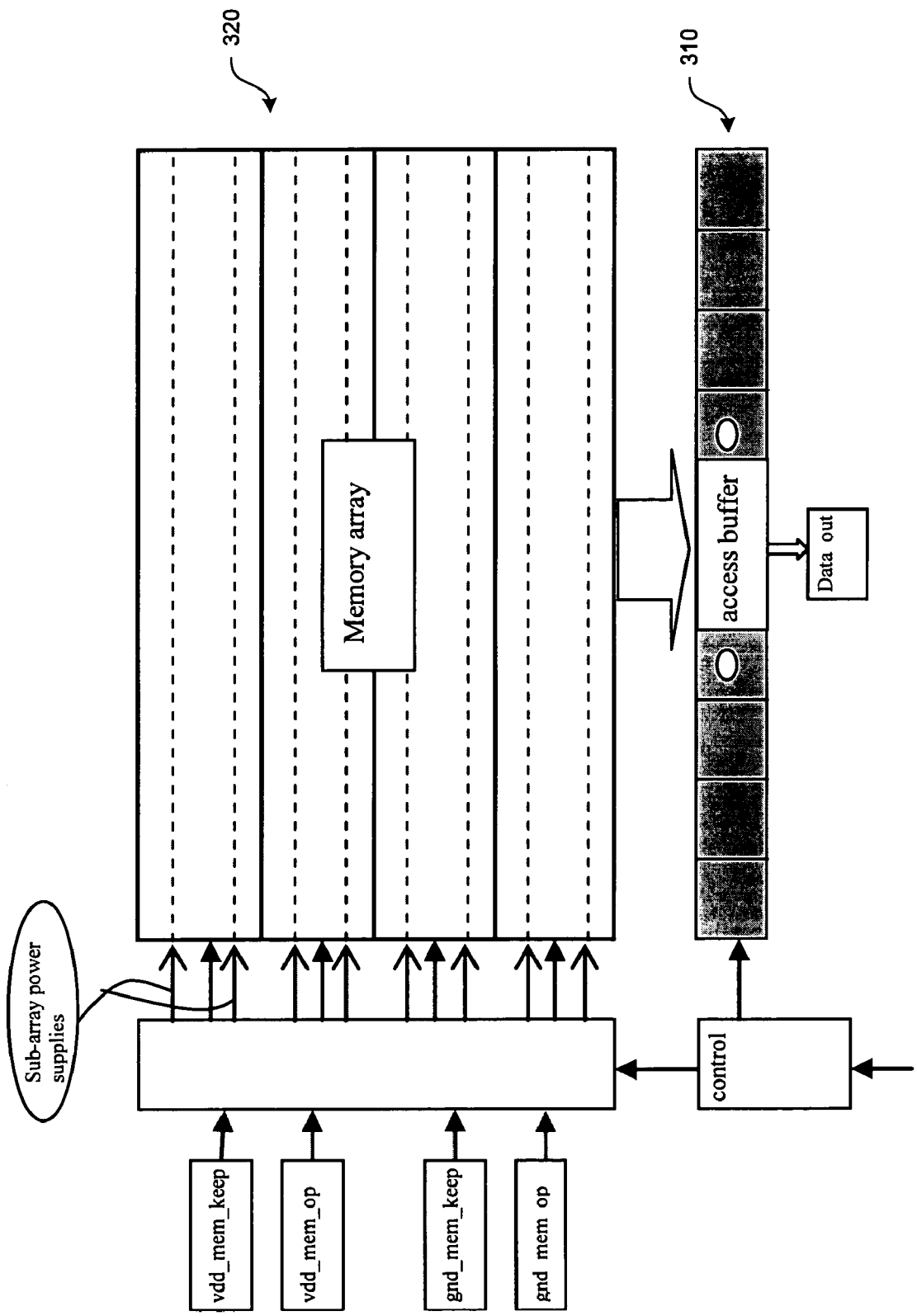
FIG. 4 depicts a memory sub-array power management control in addition to the arrangement of FIG. 2.

FIG. 4 shows an embodiment in which power and ground voltage levels are separately controlled for individual memory sub-arrays, which further reduces the power leakage by keeping a larger portion of the memory cells in the "keep state" while not being accessed.

Figure 5:
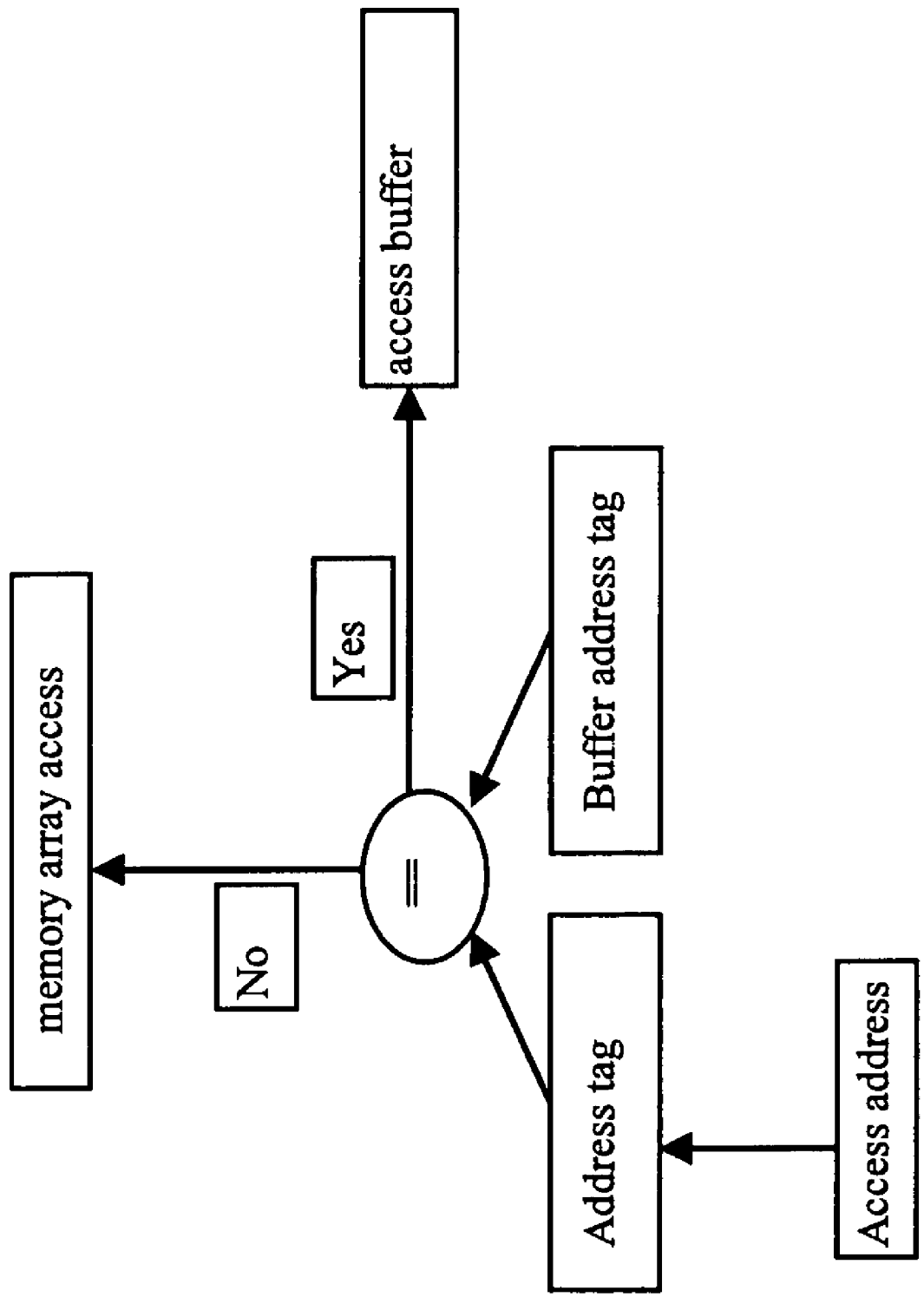
FIG. 5 illustrates an access buffer logic control.
Figure 6:
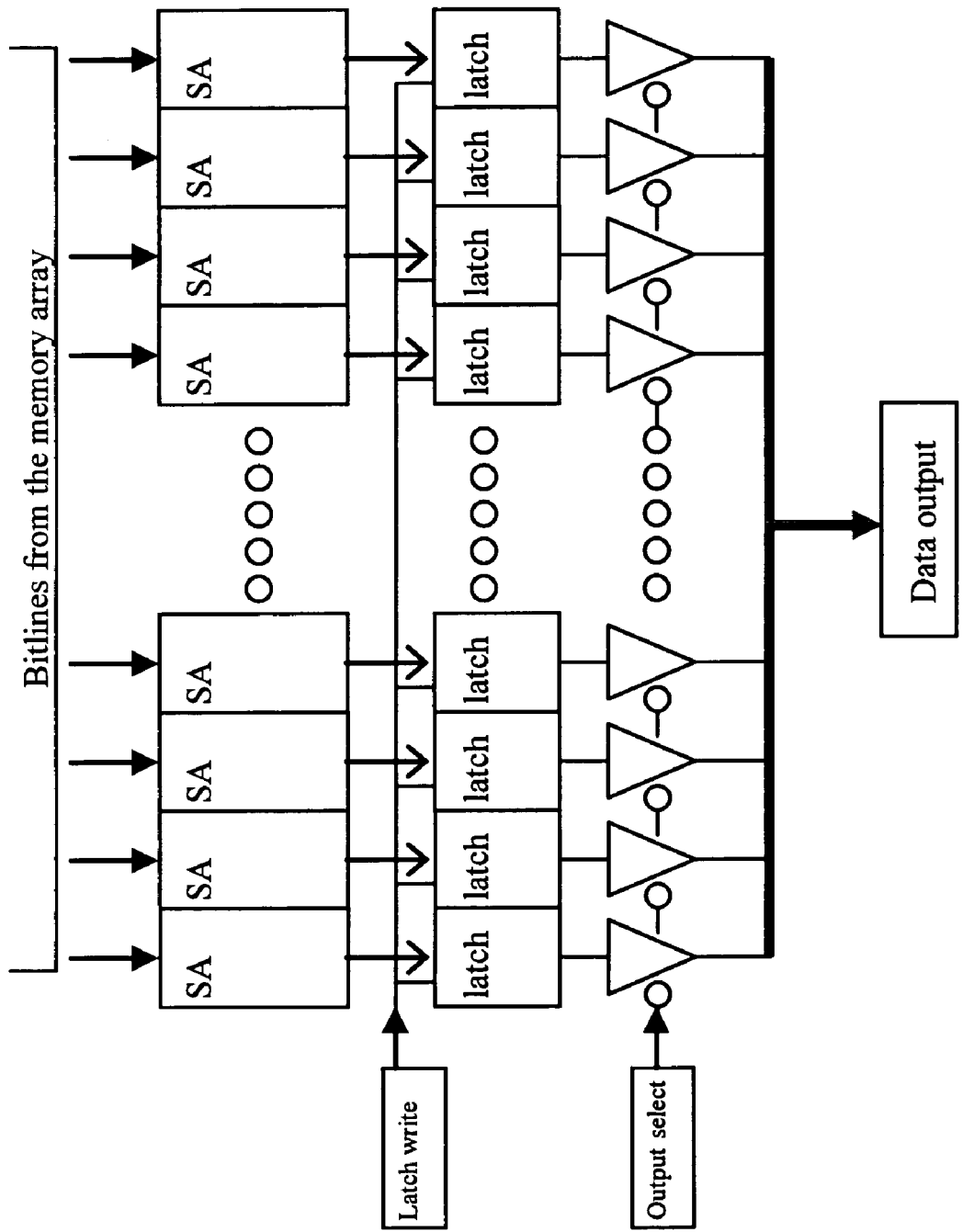
FIG. 6 illustrates an access buffer.

If an access address is beyond the access buffer, a memory array access is needed which will consume both power and time. However, using an access buffer reduces the memory array access by n times. FIG. 5 shows an example flow diagram of a logic circuit that determines if the addressed memory content resides in the access buffer or whether it needs to be directly retrieved from the memory array. FIG. 6 shows an example implementation of an access buffer, wherein the data carried by the bit-lines of the memory array are latched to be later transferred sequentially, in batches, to the output, wherein the content in the latches (access buffer) can be accessed randomly via the lower address bits.

The embodiments presented in this description, for example, can be utilized for designing data cache and instruction cache in microprocessors and DSP applications. Particularly in a DSP, there is only one level of memory in most applications and the size of the on-chip memories is becoming larger and larger. The disclosed embodiments reduce the overall power consumption of large memories while making a high performance possible.

In a microprocessor, on the other hand, even though second level caches are commonly used, the level-one caches are large size static random access memory (SRAM) arrays, which are demanded by the modern applications. Different aspects of this invention reduce the array access frequency of these level-one caches, and therefore the power consumption, without sacrificing the performance.

Figure 7:
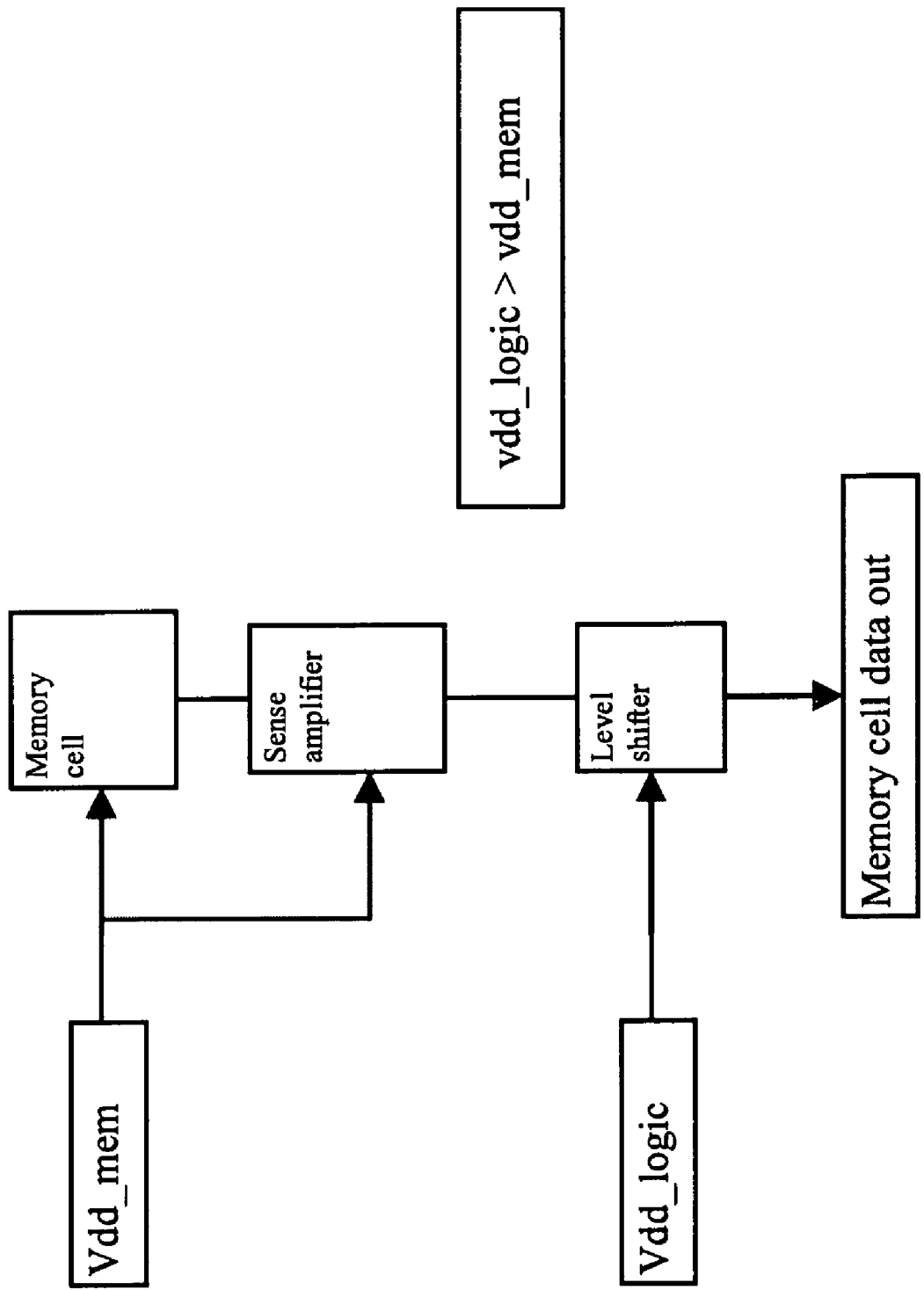
FIG. 7 illustrates a scheme to transfer signals from memory power domain to peripheral logic power domain, where a level shifter is used because a power level in the memory array is lower than that of peripheral logic circuits.

FIG. 7 shows an exemplary scheme to transfer signals from a memory power domain to peripheral logic power domain. Because the power level in the memory array is lower than that of the peripheral logic circuits, as depicted in FIG. 7, a level shifter is employed to increase the voltage level of a memory content value to the required output voltage level.

Figure 8:
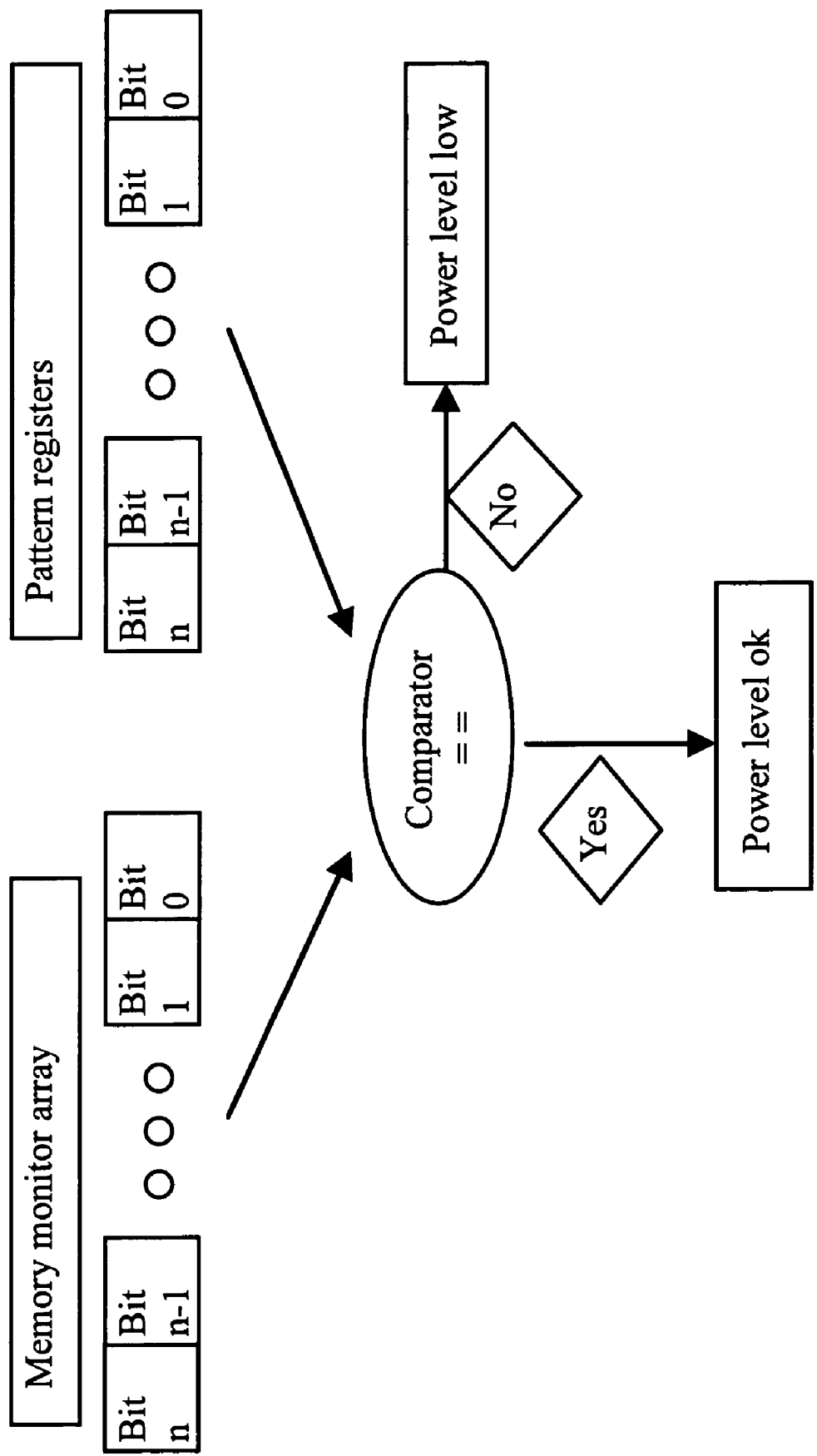
FIG. 8 depicts a scheme to monitor a minimum power level for memory cells.
Figure 9:
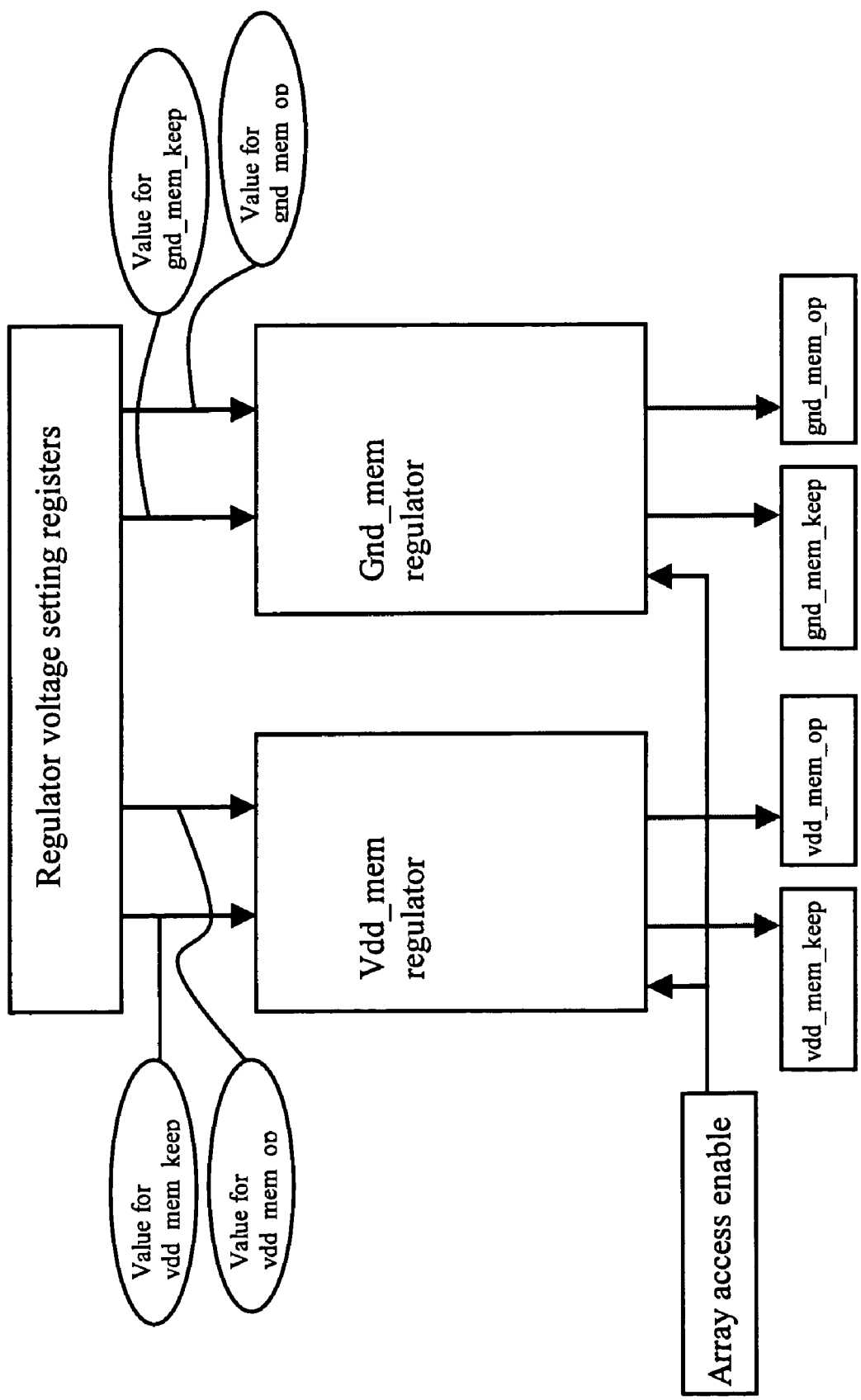
FIG. 9 depicts a scheme for sub-array power regulation, where power levels are regulated to the values stored in registers.

In some embodiments, the voltage levels of vdd_mem and gnd_mem can be controlled with a monitoring circuit, as shown in FIG. 8, or a regulating circuit, as shown in FIG. 9, to optimize the leakage current of the memory array.

FIG. 8 illustrates a scheme to monitor the minimum power level for memory cells according to an embodiment of the invention. In this embodiment, a copy of a known pattern is stored in a dedicated register of the memory array and a second copy in a part of the memory array. The comparison of the two copies of the known pattern indicates whether the power level is too low for the memory cells to store information or not, and the comparator logic will send an indication signal.

FIG. 9 illustrates an exemplary implementation of power regulation for sub-arrays. The voltage levels for memory_op and memory_keep are pre-set in a set of registers and are communicated to the voltage regulators to produce regulated power and ground voltage levels for both the "keep state" and the "access state."

Figure 10:
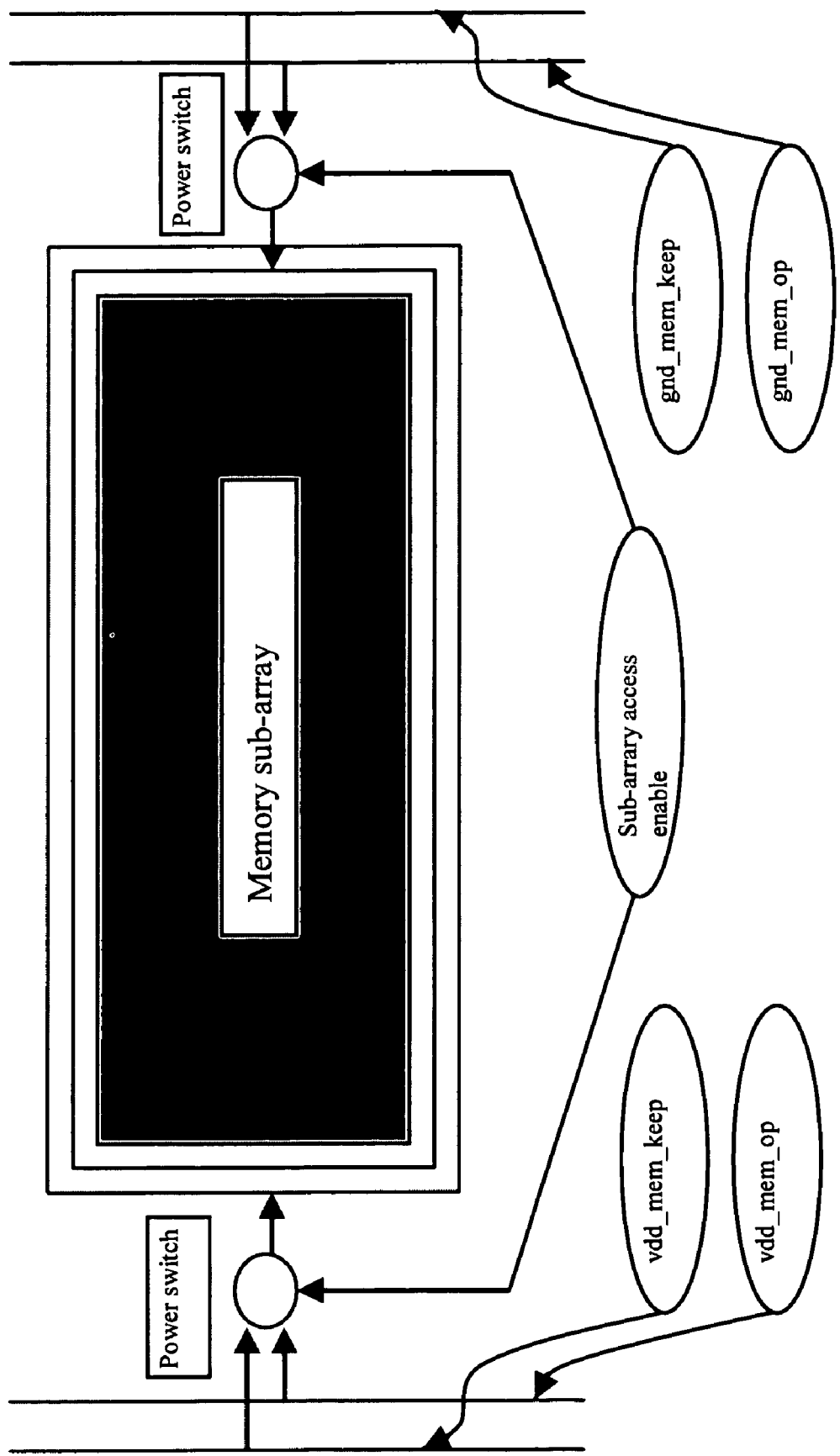
FIG. 10 illustrates power management for a sub-array.

FIG. 10 illustrates a power control and management for sub-arrays. As shown in FIG. 10, a sub-array access enable signal toggles two switches; one switch to control the power voltage level and the other switch to control the ground voltage level. During an "access state" the access enable signal routs the vdd_memory_op and the gnd_memory_op to the sub-array and during the "keep state" the access enable signal routs the vdd_memory_keep and the gnd_memory_keep to the sub-array.

Figure 11:
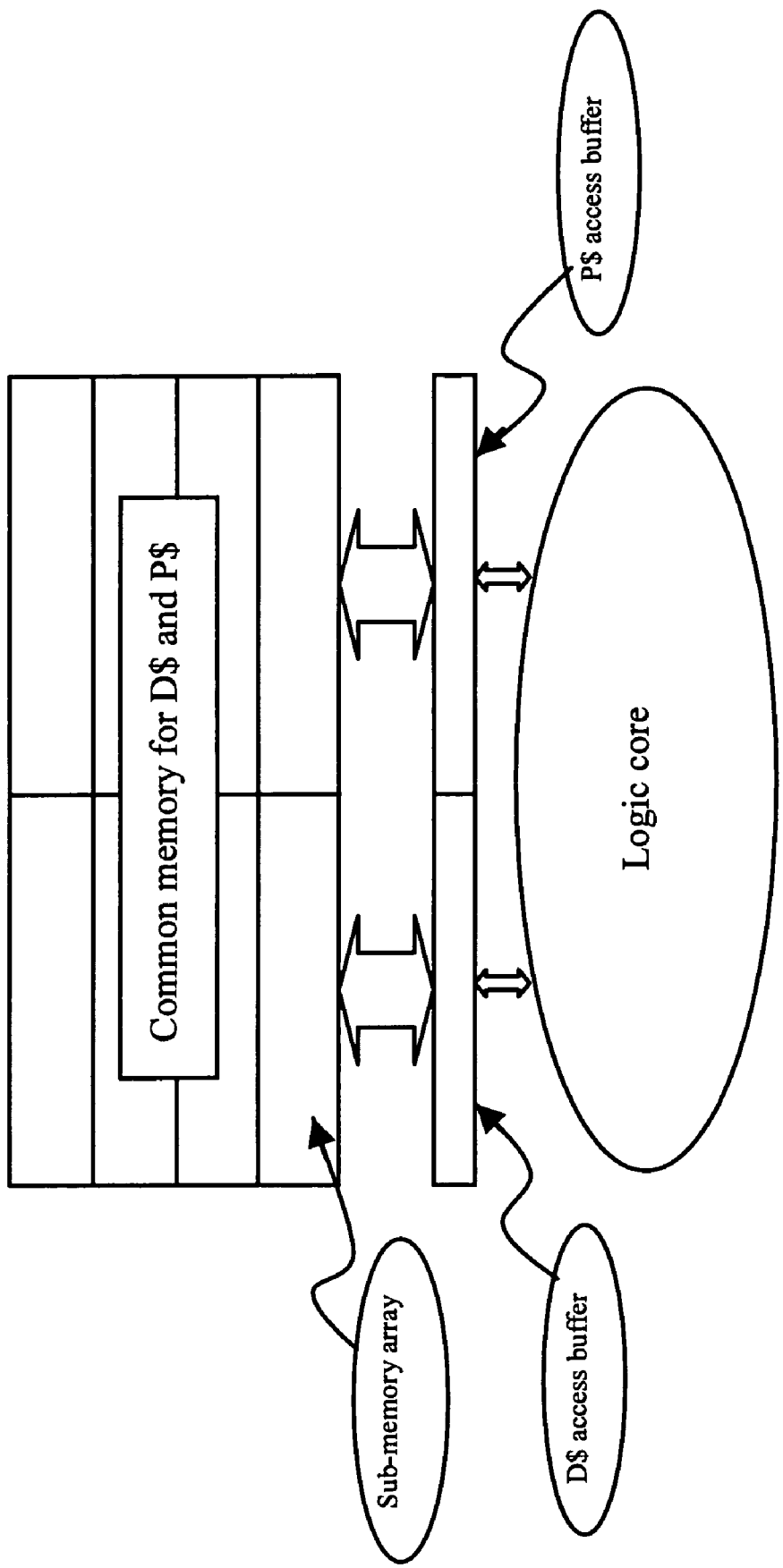
FIG. 11, illustrates a Digital Signal Processing (DSP) memory sub-system using an access buffer.

FIG. 11 illustrates a DSP memory sub-system using access buffer. In FIG. 11, D$ signifies "Data Cache," P$ signifies "Program Cache," and DSP signifies "Digital Signal Processor." In the DSP, P$ and D$ are two separate memory units whose sizes are expanding with the modern applications. P$ stores the application program, and D$ stores the data. By adopting the access buffer architecture to both P$ and D$, the operational power can be significantly reduced as described before.

A combination of P$ and D$ provides flexibility when various applications require different P$ and D$ sizes. If a memory array implements both P$ and D$, it needs to be simultaneously accessed as if there were two memory units; however, this implementation is not practical using a traditional memory array architecture because of the design penalties, such as, silicon area, logic complexity etc.

By applying the access buffer scheme, the implementation is simple with both power and speed advantages. The access buffer can be made similar to a small dual port memory, and the memory array acts as the main memory. The only performance impact occurs when both access buffers (1 for P$ and 1 for D$) need to exchange data with the main memory. In such a case, an extra cycle is needed to complete the operation. Nonetheless, this impact can be eliminated or minimized by the application software.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

The teachings of the invention provided herein can be applied to other systems, not necessarily the system described above. The elements and acts of the various embodiments described above can be combined to provide further embodiments.

Changes can be made to the invention in light of the above Detailed Description. While the above description describes certain embodiments of the invention, and describes the best mode contemplated, no matter how detailed the above appears in text, the invention can be practiced in many ways. Details of the compensation system described above may vary considerably in its implementation details, while still being encompassed by the invention disclosed herein.

As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention

We claim:

1. A memory array optimized for power consumption and performance, the memory array comprising:
    a configuration wherein the memory array is separated into sub-arrays;
    a facility for monitoring power and ground voltage levels of each sub-array;
    a facility for controlling power and ground voltage supply lines of each sub-array, wherein:
        a predetermined power voltage level and a predetermined ground voltage level are provided to any sub-array that is being accessed; and
        another predetermined power voltage level and predetermined ground voltage level are provided to any sub-array that is not being accessed; and
    a sequentially accessible memory buffer, wherein:
        a copy of contents of an accessed memory and nearby memory cells is temporarily stored in the buffer; and
        during a memory addressing operation, at first the buffer is checked and:
            if a copy of the content of the addressed memory is in the buffer, the buffer content is outputted; and
            if a copy of the content of the addressed memory is not in the buffer, then the addressed memory itself is accessed and copies of the contents of the accessed memory and the nearby cells are stored in the buffer and is outputted.

2. The memory array of claim 1, wherein power and ground voltage levels to each sub-array is controlled by increasing the power voltage and decreasing the ground voltage when a sub-array is accessed and by decreasing the power voltage and increasing the ground voltage when a sub-array is not accessed.

3. The memory array of claim 1, wherein each time the memory array is accessed, an entire cache line is read into the buffer, and wherein N sequential access is allowed to the buffer content, where:

$N=$(cache line)/(input/output width).

4. The memory array of claim 1, wherein an address buffer is associated with the memory buffer to retain the address of the memory a copy of whose content resides in the buffer, and wherein the address buffer content is compared with the memory address during an initial stage of an access operation to inspect if the content of the addressed memory is already in the memory buffer.

5. The memory array of claim 1, wherein to output an accessed memory content a level shifter increases voltage level of the memory content to a required output voltage level.

6. The memory array of claim 1, wherein to monitor a memory array power level, copies of a known data pattern stored in the memory array and in a dedicated pattern register are compared and comparison results indicate whether the memory array power level is low or meets requirements.

7. The memory array of claim 1, wherein controlled power voltage levels during access and idle periods are provided by a power voltage regulator and controlled ground voltage levels during access and idle periods are provided by a ground voltage regulator, and wherein the power and the ground voltage regulators receive pre-set inputs from appropriate voltage setting registers.

8. The memory array of claim 1, wherein a first and a second switch, operated by a sub-array enable signal, are utilized to control the power and ground voltage levels of the sub-array, respectively.

9. A method for optimizing a memory array power consumption and performance speed, the method comprising:
    providing power and ground voltage supply lines to the memory array;
    dividing the memory array into sub-array blocks;
    providing dedicated and separately controllable power and ground voltage supply lines to each sub-array block; and
    supplying one set of power voltage and ground voltage to a sub-array block while the said sub-array block is being addressed, and supplying a different set of power voltage and ground voltage to the said sub-array block while the said sub-array block is not being addressed.

10. The memory array of claim 9, wherein power and ground voltage levels to each sub-array is controlled by increasing the power voltage and decreasing the ground voltage when a sub-array is accessed and by decreasing the power voltage and increasing the ground voltage when a sub-array is not accessed.

11. The memory array of claim 9, wherein each time the memory array is accessed, an entire cache line is read into the buffer, and wherein N sequential access is allowed to the buffer content, where:

$N=$(cache line)/(input/output width).

12. The memory array of claim 9, wherein an address buffer is associated with the memory buffer to retain the address of the memory a copy of whose content resides in the buffer, and wherein the address buffer content is compared with the memory address during an initial stage of a memory addressing operation to inspect if the content of the addressed memory is already in the memory buffer.

13. The memory array of claim 9, wherein to output an accessed memory content, a level shifter increases voltage level of the memory content to a required output voltage level.

14. The memory array of claim 9, wherein to monitor a memory array power level, copies of a known data pattern is stored in the memory array and in a dedicated pattern register and are compared, and wherein comparison results indicate whether the memory array power level is too low or meets requirements.

15. The memory array of claim 9, wherein controlled power voltage levels during access and idle periods are provided by a power voltage regulator and controlled ground voltage levels during access and idle periods are provided by a ground voltage regulator, and wherein the power and the ground voltage regulators receive pre-set inputs from appropriate voltage setting registers.

16. The memory array of claim 9, wherein a first and a second switch, both operated by a sub-array enable signal, are utilized to control the power and ground voltage levels of the sub-array, respectively.

17. A memory array comprising:
 a configuration wherein the memory array is separated into sub-arrays;
 a means for monitoring power and ground voltage levels of each sub-array;
 a means for controlling power and ground voltage levels to each sub-array, wherein:
  a first power voltage level and a first ground voltage level are provided to any sub-array that is being accessed; and
  a second power voltage level and a second ground voltage level are provided to any sub-array that is not being accessed; and
 a memory buffer means for temporarily storing data, wherein:
  a copy of contents of an accessed memory and nearby memory cells is temporarily stored in the buffer; and
  during a memory access operation, at first the buffer is checked and:
   if a copy of the content of an addressed memory is in the buffer, the buffer content is outputted; and
   if a copy of the content of the addressed memory is not in the buffer, then the addressed memory itself is accessed and copies of the contents of the accessed memory and the nearby cells are stored in the buffer and is outputted.

18. The memory array of claim 17, wherein the means for monitoring a memory array power level, uses copies of a known data pattern stored in the memory array and in a dedicated pattern register to compare, wherein comparison results indicate whether the memory array power level is low or sufficient.

19. The memory array of claim 17, wherein the control means for power and ground voltage levels supplied to each sub-array comprises a power voltage regulator and a ground voltage regulator that receive pre-set inputs from appropriate voltage setting registers.

20. The memory array of claim 17, wherein the memory buffer means comprises a sequentially accessible register and an associated address tag buffer to keep track of the memory locations contents of which are in the memory buffer.

* * * * *